United States Patent [19]
Tam et al.

[11] Patent Number: 5,514,981
[45] Date of Patent: May 7, 1996

[54] RESET DOMINANT LEVEL-SHIFT CIRCUIT FOR NOISE IMMUNITY

[75] Inventors: David C. Tam; Chongwook C. Choi, both of Redondo Beach, Calif.

[73] Assignee: International Rectifier Corporation, El Segundo, Calif.

[21] Appl. No.: 273,695

[22] Filed: Jul. 12, 1994

[51] Int. Cl.$^6$ ............................................. H03K 19/0175
[52] U.S. Cl. ............................ 326/80; 327/198; 327/166
[58] Field of Search ................................... 326/80, 81, 63, 326/98, 27; 327/166, 198, 208, 210

[56] References Cited

U.S. PATENT DOCUMENTS

| | | | |
|---|---|---|---|
| 4,694,256 | 9/1987 | Kawamura | 327/166 |
| 4,940,904 | 7/1990 | Lin | 327/166 |
| 5,105,099 | 4/1992 | Routh et al. | |
| 5,305,271 | 4/1994 | Watanabe | 327/198 |
| 5,406,140 | 4/1995 | Wert | 326/81 |

FOREIGN PATENT DOCUMENTS 2244400  11/1991  United Kingdom .

*Primary Examiner*—Edward P. Westin
*Assistant Examiner*—Andrew Sanders
*Attorney, Agent, or Firm*—Ostrolenk, Faber, Gerb & Soffen

[57] ABSTRACT

The logic circuit of the level shifting circuit of a high side MOS gate device is made reset dominant to make the circuit immune to noise glitches. The reset dominance is obtained by causing a reset signal to be produced at a wider range of high side floating supply offset voltage than that at which the set signal can be produced to prevent the chance of a set when the high side power MOSFET should be off. The reset dominance is obtained by increasing the size of the reset voltage dropping resistor or by adjusting the input threshold of the circuit reading the set and reset voltage dropping resistors.

10 Claims, 2 Drawing Sheets

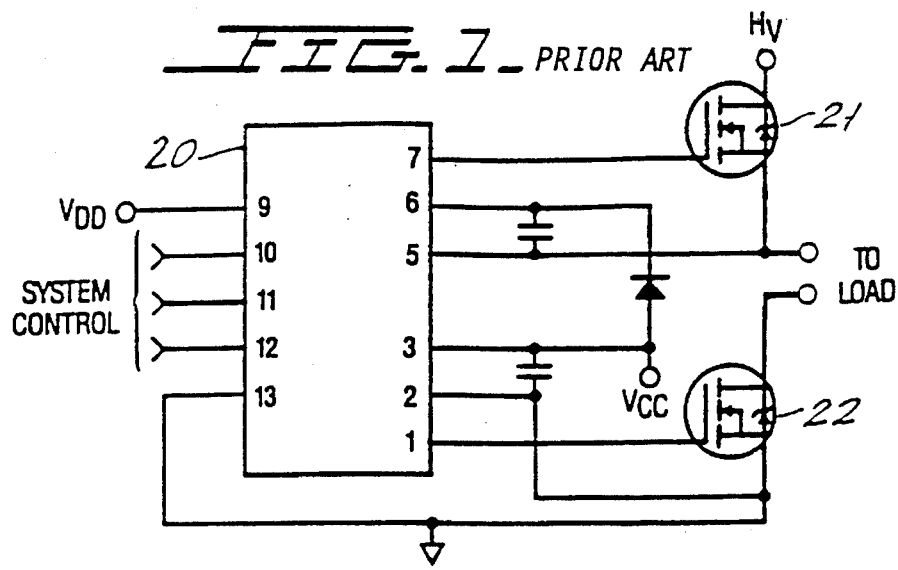
FIG. 1 — PRIOR ART
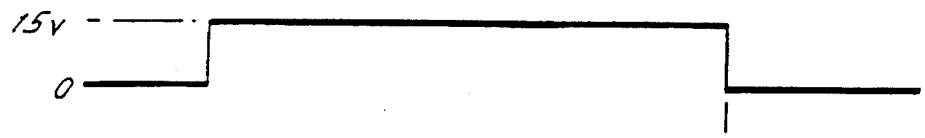
FIG. 3a.
FIG. 3b.
SET PULSES
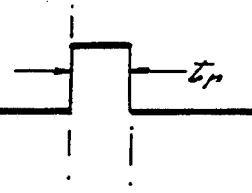
FIG. 3c.
RESET PULSES
FIG. 3d.
$V_{ds}$, RESET >
$V_{ds}$, SET
FIG. 3e.
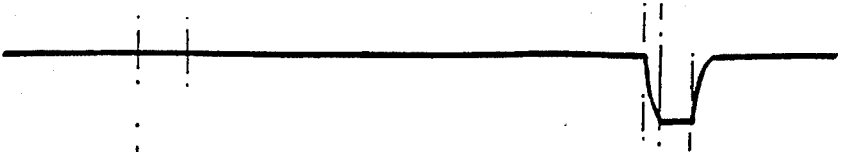
FIG. 3f.
$\overline{Q}$ OF RS LATCH 94

RESET DOMINANT LEVEL-SHIFT CIRCUIT FOR NOISE IMMUNITY

BACKGROUND OF THE INVENTION

The present invention relates to a novel level shifting circuit which provides immunity to false operation due to unintended transient noise pulses in the circuit.

Level shifting circuits for shifting the potential of a small control signal to a higher or lower voltage level are well known, and are frequently integrated into a power integrated circuit chip. A typical device of this type is the IR2112 sold by the International Rectifier Corporation, the assignee of the present invention. The IR2112 is a high voltage, high speed MOS gated power device for driving the gate of a power MOSFET or insulated gate bipolar transistor (hereinafter an "IGBT"), with independent high side and low side output channels. It has logic inputs supplied by the user of the driver chip. The floating high side channel may be used to drive an N-channel power MOSFET or IGBT which operates off a high voltage rail at up to 600 volts. Hereinafter the term "power MOSFET" is intended to include any MOS gated device including conventional power MOSFETs, IGBTs, thyristors, whether discrete or integrated with the control circuits.

The level shift circuit used in such a high voltage power integrated circuit chip is often implemented with two identical level shift circuit branches—one for set and one for reset—to reduce power dissipation in the chip. In such an implementation, the input logic signal is converted into two narrow pulses at its rising and falling edges. By level shifting these two pulses instead of the logic signal, the level shift circuits are turned on only briefly thereby dissipating much less power.

A possible problem with such a level shift circuit is false operation, that is, production of an output which is not called for by the logic input, under the influence of a noise "glitch" or false pulse. With the set and reset branches being identical, when the circuit is operated under a bias condition at which the circuit starts to lose is functionality, process variation will cause either one of the branches to lose functionality first. When this bias condition for unpredictability is combined with a noise glitch at the input of the chip, the output of both the level shift circuit and the chip can produce unwanted signals.

In an application of the power integrated circuit chip, its output would stay high if only the set branch responds to the input glitch. If the chip was used as a driver for a half bridge or totem-pole arranged power MOSFETs, this will cause an undesirable "shoot-through" condition in the driven half-bridge circuit. A good example of this condition is during the reverse recovery of a half-bridge circuit where the output of the half-bridge falls below the ground at the same time a noise glitch is generated at the input of the driver IC.

BRIEF DESCRIPTION OF THE INVENTION

In accordance with the present invention, the level shift circuit of the prior art is made to be reset dominant. This can be implemented in several ways. In a first embodiment of the invention, the voltage dropping resistor in the reset circuit is made higher in value than resistor in the set circuit.

Alternately, and in a second embodiment of the invention, the input threshold voltage of the floating logic circuit for the set signal is made lower than that of the logic circuit for the reset signal.

In general, a circuit modification is made such that the reset branch of the level shift circuit has a wider bias range for logic operation. In this way, the level-shift circuit, when biased at the edge of its operation range, would generate a level-shifted signal either identical to the input signal or in the off state, but not in the on state. Thus, the novel reset dominant level-shifted circuit is far more predictable than the prior art circuit.

Other features and advantages of the present invention will become apparent from the following description of the invention which refers to the accompanying drawings.

BRIEF DESCRIPTION OF THE DRAWINGS

FIG. 1 is a schematic diagram of a known IR2112 power integrated circuit which drives a pair of power MOSFETs.

FIGS. 3a to 3f are diagrams on a common time base of voltages at different points in the diagram of FIG. 2.

DETAILED DESCRIPTION OF THE INVENTION

Figure 2:
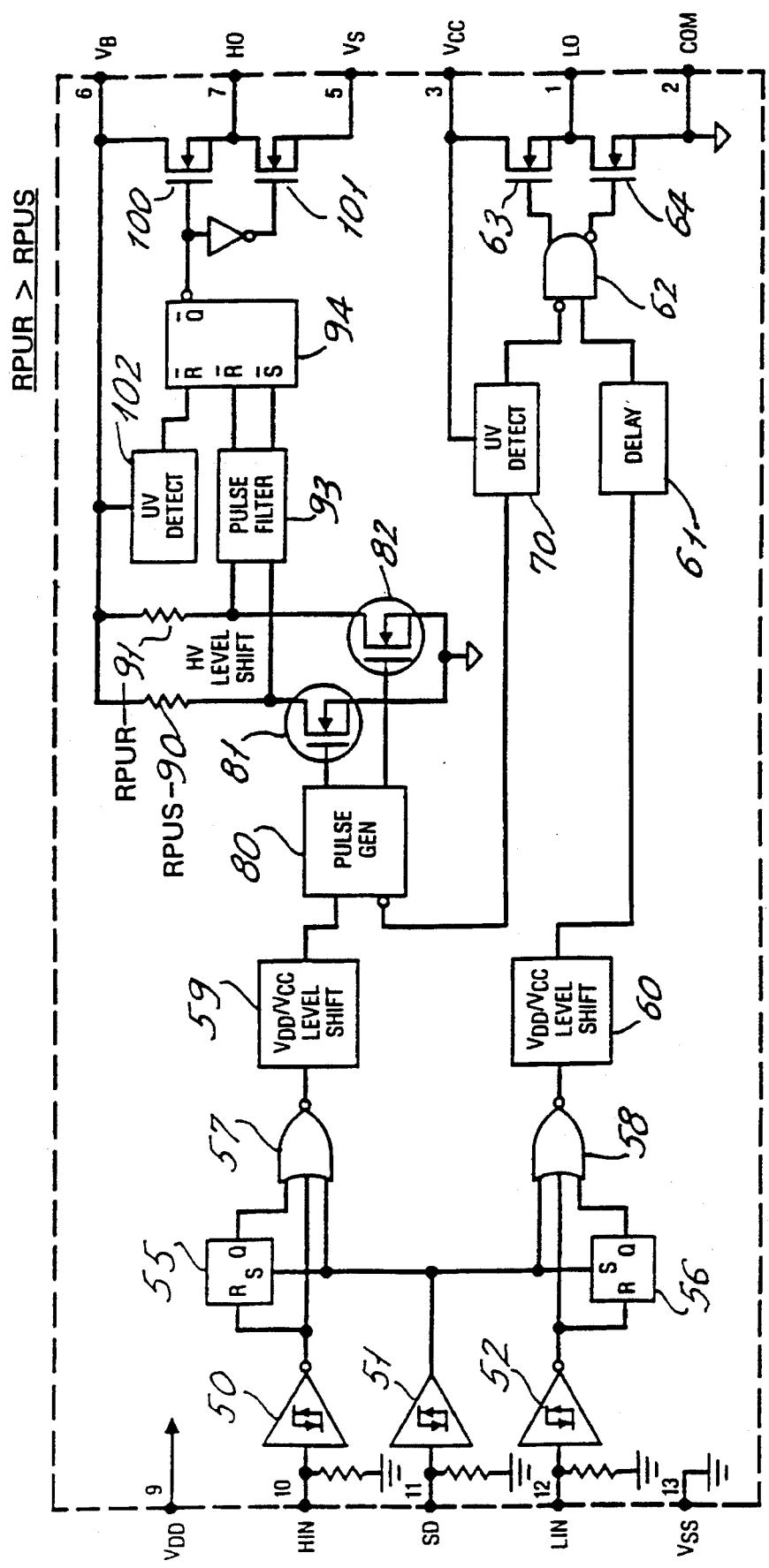
FIG. 2 shows a functional block diagram of the power integrated circuit of FIG. 1 and particularly shows the present invention wherein the resistance of the reset resistor in the high voltage level shift circuit is greater than the resistance of the set resistor, making the circuit reset dominant.

Referring first to FIG. 1, there is shown, in schematic form, a known power integrated circuit 20 which acts as a high voltage MOS gate driver for power MOSFETs 21 and 22. The integrated circuit 20 has output pins numbered 1–3, 5–7 and 9–13.

The pins in FIG. 1 and in other following figures have the following assignments:

| Pin No. | Assignment |
| --- | --- |
| 1 (LO) | Low side output voltage (to gate of low side MOSFET 22), which swings, for example, from 0 to 20 volts. |
| 2 (COM) | Common ground connection. |
| 3 (VCC) | Low side fixed supply voltage, for example, 20 volts. |
| 5 (VS) | High side floating supply offset voltage (for example, 600 volts) |
| 6 (VB) | High side floating supply absolute voltage (for example, 620 volts) |
| 7 (HO) | High side output voltage (to gate of high side MOSFET 21), which swings, for example, between 600 and 620 volts. |
| 9 (VDD) | Logic supply voltage (20 volts). |
| 10 (HIN), 11 (SD), 12 (LIN) | Low voltage logic inputs for the desired control of the output voltage at pins 1 and 7. |
| 13 (VSS) | The logic supply ground. |

FIG. 2 is a functional block diagram of the circuit contained within the integrated circuit 20 in FIG. 1. The pin numbers in FIG. 2 correspond to the same numbered pins of FIG. 1. The operation of the level shift circuit of FIG. 2 is best understood with reference to the waveforms of FIGS. 3a through 3f which show the pulse shape at various points in the circuit.

In general, the structure in FIG. 2 is implemented as a monolithic high voltage chip and acts as a high speed, two channel power MOSFET or IGBT driver. Logic input pins 10, 11 and 12 are connected through Schmitt triggers 50, 51 and 52 to the RS latches 55 and 56. Latches 55 and 56 are connected through gates 57 and 58, respectively, to level shift circuits 59 and 60. As will be seen, the outputs of the level shift circuits 59 and 60 control the high side control output and low side control output at pins 7 and 1, respectively.

The output from level shift circuit 60 in the low voltage channel is applied through a delay circuit 61 to one input of gate circuit 62. The output of gate 62 is connected to the gate electrodes of output MOSFET transistors 63 and 64. As will be later described, these transistors will produce a gate voltage at pin 1 when required by the logic input to pins 11 and 12.

FIG. 3 also contains an undervoltage detection circuit 70 which disables the output from gate 62 when an undervoltage is detected at pin 3 to prevent turn-on of the power MOSFET or IGBT operated from pin 1.

The level shift circuit 59 for the high voltage channel of the circuit has one input connected to the pulse generator 80. Undervoltage detection circuit 70 is also connected to pulse generator 80 and will turn of the high voltage output channel responsive to the detection of an under-voltage condition at pin 3.

The driver of FIG. 3 essentially translates the logic input signals at pins 10, 11 and 12 to corresponding in phase, low impedance outputs. The low side channel output pin 1 is referenced to the fixed rail at pin 3 and the high side channel output at pin 7 is referenced to the floating rail at pin 6 with offset capability up to 600 volts.

For the high side channel, narrow on and off pulses triggered, respectively, by the rising and falling edge of input HIN in FIG. 3a are generated by the pulse generator 80. The respective pulses, shown in FIGS. 3b and 3c, are used to drive the separate high voltage level transistors 81 and 82 which set or reset the RS latch 94 operating off the floating rail. The output of the RS latch 94, shown in FIG. 3f, is then used to turn MOSFETs 100 and 101 on and off. Thus, if a high signal is applied to input R of the RS latch, the output at pin 7 is turned off. If a high signal is applied to the S input of latch 94, the output at pin 7 will turn on.

The sources of MOSFETs 81 and 82 are connected to a common rail and their drains are connected to resistors 90 and 91, respectively. The use of MOSFETs is optional and the circuit could also be implemented with a bipolar level shift transistor.

During normal operation, the application of pulses to MOSFETs 81 and 82 from the pulse generator 80 will produce output voltage pulses Vset and Vrst at the nodes between MOSFETs 81 and 82 and their respective resistors 90 and 91. Pulses Vset and Vrst have the waveforms shown in FIGS. 3d and 3e, respectively. Level shifting of the ground reference HIN signal at pin 10 is thus accomplished by transposing the signal referenced to the floating rail. Because each high voltage level shift transistor 81 and 82 is turned on for only the duration of the short on or off pulses with each set or reset event, power dissipation is minimized.

The high voltage level shifting circuit is designed to function normally even when the potential at pin 5 swings more than 5 volts below and up to 600 volts above the voltage of pin 2. The negative swing of pin 5 can occur during the recirculation period of the output free-wheeling diode in a circuit of the type shown in FIG. 1.

The level shift circuit described so far has a problem where the signal at pin 7 becomes unpredictable if a signal is sent to pin 10 while VB and VS are held such that the level shift circuit is at the verge of losing its functionality. With two identical branches in the level shift circuit, RPUR and RPUS in FIG. 2 have same value and therefore Vds, set and Vds, reset pulses in FIG. 3 are also of same height. As VS and VB fall, the level shift circuit would eventually lose its functionality because the height of the pulses Vset and Vrst, shown in FIGS. 3d and 3e, would decrease and the pulse filter 93 of FIG. 2 can no longer read those pulses. With process variation, either RPUS or RPUR will be larger than the other from chip to chip on a random basis. This, in turn, leads to one of the two level shift circuit branches operating with a wider bias range when VB falls closer to COM. In a chip in which the operation range of the set circuit is wider, a pulse signal sent into pin 10 while VS and VB are held such that only the set circuit is operational would leave pin 7 in the on state permanently. Likewise, in a chip in which the operation range of the reset circuit is wider, a pulse signal sent into pin 10 while VS and VB are held such that only the reset circuit is operational would leave pin 7 in the off state permanently.

This uncertainty is troublesome in the case of the power integrated circuit shown in FIGS. 1 and 2. In the case where the set branch has a wider operation range, it would be possible for pin 10 to go high unexpectedly. For instance, in FIG. 1, if a noise pulse is generated at pin 10 during the recirculation period where the VS pin falls below the ground, pin 7 could be turned on and remain on. This will certainly lead to a "shoot-through" condition where both of the power MOSFETs in FIG. 1 will turn on simultaneously, which is an undesirable situation.

In accordance with the invention, the resistor 91 (RPUR) is made greater than the resistor 90 (RPUS) to make the level shift circuit reset-dominant. This will guarantee that Vds, reset of FIG. 3 will have a higher amplitude than Vds, set and that the operation range of the reset branch of the level shift circuit is wider than the set branch. By way of example, resistor 90 may be 1300 ohms and may be in the range of 1150 to 1450 ohms. Resistor 91 may be 1800 ohms and may be in the range of 1600 to 2000 ohms. Preferably resistor 91 is about 30% higher than resistor 90.

With this change, the level shift circuit performs in the following predictable manner as VS falls below the ground and VB follows along with it. When both Vds,set and Vds,reset can be read by the circuit 93 in FIG. 2, the input-to-output logic functions properly. As VS and VB fall further and the circuit 93 can only read Vds,reset, pin 7 stays low. When VS and VB fall even further and neither Vds,set nor Vds,reset can be read by the circuit 91, pin 7 remains low. With this predictable behavior of the level shift circuit, a "shoot-through" condition will not occur in the circuit of FIG. 1. The reset dominance can also be implemented in other ways, for instance, by adjusting the set and reset input threshold level for the pulse filter 93 in FIG. 2.

The invention may also be applied when level shifting from a high to a low voltage. In that case, the level shift transistor would become a P-channel MOSFET or PNP transistor, and the pull-up resistor 90 would become a pull-down resistor or other current sink type. The reset dominance can be implemented as shown for the level shift up circuit.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A reset-dominant level-shifting circuit for translating a logic voltage state from one voltage level to a different voltage level; said level-shifting circuit comprising a set level circuit for producing an output signal for turning on a power MOSFET and a reset level circuit for turning off said power MOSFET; a pulse generator for producing a reset signal coupled to said reset level circuit and a set level signal coupled to said set level circuit which are in response to input signals to said pulse generator; and reset-dominant circuit means connected to said reset level circuit for operating said reset level circuit to turn off said power MOSFET with a lower input signal than is required to operate said set level circuit.

2. The circuit of claim 1 which further includes latch logic circuit means connected to the outputs of said set and reset level circuits; said latch logic circuit means coupled to said power MOSFET and generating gate signals to turn said power MOSFET on and off in response to the receipt of set and reset signals respectively from said set and reset level circuits.

3. The circuit of claim 1 wherein said set and reset level circuits have respective threshold levels for their operations; said threshold level of said set level circuit being lower than that of said reset level circuit.

4. The circuit of claim 2 wherein said set and reset level circuits have respective threshold levels for their operations; said threshold level of said set level circuit being lower than that of said reset level circuit.

5. The circuit of claim 1 wherein said set and reset level circuits have respective voltage dropping resistors for producing said output set and reset levels; said resistor in said reset level circuit having a higher value than said resistor in said set level circuit.

6. The circuit of claim 2 wherein said set and reset level circuits have respective voltage dropping resistors for producing said output set and reset levels; said resistor in said reset level circuit having a higher value than said resistor in said set level circuit.

7. The circuit of claim 1 wherein said power MOSFET is the high side power MOSFET of a pair of power MOSFETs connected in a half bridge circuit; said reset dominant level shifting circuit preventing the simultaneous turn on of said pair of power transistors by noise signals which are applied to said reset level circuit.

8. The circuit of claim 2 wherein said power MOSFET is the high side power MOSFET of a pair of power MOSFETs connected in a half bridge circuit; said reset dominant level shifting circuit preventing the simultaneous turn on of said pair of power transistors by noise signals which are applied to said reset level circuit.

9. The circuit of claim 3 wherein said power MOSFET is the high side power MOSFET of a pair of power MOSFETs connected in a half bridge circuit; said reset dominant level shifting circuit preventing the simultaneous turn on of said pair of power transistors by noise signals which are applied to said reset level circuit.

10. The circuit of claim 5 wherein said power MOSFET is the high side power MOSFET of a pair of power MOSFETs connected in a half bridge circuit; said reset dominant level shifting circuit preventing the simultaneous turn on of said pair of power transistors by noise signals which are applied to said reset level circuit.

\* \* \* \* \*